United States Patent [19]

Liang et al.

[11] Patent Number: 5,576,234
[45] Date of Patent: Nov. 19, 1996

[54] METHOD FOR MANUFACTURING AN EPROM

[75] Inventors: Kuei-Chang Liang; Yeu-Haw Yang, both of Hsin-Chu, Taiwan

[73] Assignee: Hualon Microelectronics Corporation, Hsin-Chu, Taiwan

[21] Appl. No.: 554,969

[22] Filed: Nov. 13, 1995

[51] Int. Cl.$^6$ ............................................. H01L 21/8247
[52] U.S. Cl. ................................................ 437/43; 437/52
[58] Field of Search .................................. 437/43, 48, 52

[56] References Cited

U.S. PATENT DOCUMENTS

| 5,236,853 | 8/1993 | Hsue | 437/43 |
| 5,418,741 | 5/1995 | Gill | 365/182 |
| 5,432,110 | 7/1995 | Inoue | 437/43 |
| 5,466,622 | 11/1995 | Cappelletti | 437/52 |
| 5,510,283 | 4/1996 | Maari | 437/43 |

*Primary Examiner*—Mary Wilczewski
*Assistant Examiner*—Richard A. Booth
*Attorney, Agent, or Firm*—Foley & Lardner

[57] ABSTRACT

A memory cell manufacturing method includes the steps of: providing a silicon substrate with buried regions that are spaced by a channel; depositing a gate oxide layer over the substrate; removing a portion of the gate oxide layer which is over the channel; depositing a first polysilicon layer over remaining portions of the gate oxide layer and over exposed portion of the substrate; growing an insulating layer over the polysilicon layer; providing a first mask on the insulating layer, the mask having a length shorter than that of the insulating layer and two end portions which overlap respectively the buried regions; etching portions of the insulating layer and the polysilicon layer not covered by the mask; depositing a thin oxide layer over a remaining portion of the insulating layer; depositing a second polysilicon layer over the thin oxide layer and over the buried layers; providing a second mask, which has a width narrower than that of the second polysilicon layer, on the second polysilicon layer to define a control gate region; etching portions of the second polysilicon layer not covered by the second mask so as to form a control gate; growing a thick oxide layer on a remaining portion of the second polysilicon layer; and etching the insulating layer and the first polysilicon layer with the thick oxide layer serving as a mask.

12 Claims, 3 Drawing Sheets

"METHOD FOR MANUFACTURING AN EPROM"

METHOD FOR MANUFACTURING AN EPROM

BACKGROUND OF THE INVENTION

1. Field of the Invention

This invention relates to a method for manufacturing a memory cell, more particularly to a low cost method for manufacturing a memory cell which has a high capacitance coupling ratio and a high integrity.

2. Description of the Related Art

Referring to FIG. 1, a first type of a conventional memory cell is shown. The conventional memory cell has a so-called flat cell structure and is manufactured in the following manner: field oxidizing a substrate so as to form a field oxide layer over the substrate; removing a portion of the field oxide layer so as to form two field oxide layers that are spaced by a channel; depositing a gate oxide layer over remaining portions of the field oxide layer and over the exposed substrate; removing a portion of the gate oxide layer which is over the channel; depositing a first polysilicon layer over remaining portions of the gate oxide layer and over the exposed substrate; growing an insulating layer over the first polysilicon layer; providing a first mask on the insulating layer, the first mask extending along the channel and having a length shorter than that of the insulating layer, the first mask further having two end portions which overlap respectively the remaining portions of the field oxide regions; etching the insulating layer and the first polysilicon layer that are not covered by the first mask; depositing a second polysilicon layer over a remaining portion of the insulating layer and over the exposed gate oxide layer; providing a second mask on the second polysilicon layer to define a control gate region, the second mask having a width narrower than that of the second polysilicon layer; etching portions of the second polysilicon layer that are not covered by the second mask so as to form a control gate; removing the second mask; providing a third mask on a remaining portion of the second polysilicon layer; etching the insulating layer and the first polysilicon layer so as to form a floating gate beneath the control gate; and removing the third mask.

Since the two end portions of the floating gate 12 of the conventional memory cell manufactured in the above-described conventional method overlap respectively the remaining portions of the field oxide layer due to the first mask, the conventional memory cell of FIG. 1 has a high capacitance coupling ratio which can be approximated by dividing the area of the floating gate 12 by the total area of the floating gate 12 and the channel and which is at least greater than 0.7. It should be noted that a memory cell having a high capacitance ratio has a good writing characteristic. However, the occupied cell size of the memory cell shown in FIG. 1 is relative large, thus, high integrity cannot be achieved. Furthermore, a trench effect caused by excessive etching will occur around the drain terminal such that the drain terminal impedance is relative high, thereby slowing the operating speed of the memory cell.

Referring now to FIG. 2, a second type of a conventional memory cell is shown. The conventional memory cell also has a flat cell structure and is manufactured in the following manner: implanting impurities into a substrate so as to form first and second buried regions that are spaced by a channel; depositing a gate oxide layer over the substrate; removing a portion of the gate oxide layer which is over the channel; depositing a first polysilicon layer over remaining portions of the gate oxide layer and over the exposed substrate; growing an insulating layer over the first polysilicon layer; providing a first mask on the insulating layer, the first mask extending along the channel and having a length equal to that of the channel; etching the insulating layer and the first polysilicon layer that are not covered by the first mask; depositing an oxide layer over a remaining portion of the insulating layer and the exposed gate oxide layer; etching the oxide layer down to the insulating layer by the method of etchback so as to protect the buried regions; depositing a second polysilicon layer over the remaining portion of the insulating layer and over remaining portions of the oxide layer; providing a second mask on the second polysilicon layer to define a control gate region, the second mask having a width narrower than that of the second polysilicon layer; etching portions of the second polysilicon layer that are not covered by the second mask so as to form a control gate; removing the second mask; providing a third mask on a remaining portion of the second polysilicon layer; etching the insulating layer and the first polysilicon layer so as to form a floating gate beneath the control gate; and removing the third mask.

Since the two end portions of the floating gate 20 of the conventional memory cell shown in FIG. 2 do not overlap respectively the buried regions due to the first mask, the occupied cell size of the conventional memory cell of FIG. 2 is relatively small. Thus, a relatively high integrity can be achieved. However, since the length of the floating gate 20 is equal to that of the channel, the conventional memory cell shown in FIG. 2 has a low capacitance coupling ratio, which is approximately equal to 0.5. Moreover, while the purpose of the etchback step is to prevent the occurrence of the trench effect, etchback is difficult to control in mass production and complicates the manufacturing process.

Furthermore, the step of providing a third mask and the step of removing the third mask in the above-described conventional methods for manufacturing the conventional memory cells of FIGS. 1 and 2, are both cost-ineffective and time-consuming steps. Moreover, since an undercut will occur due to excessive etching when the insulating layer and the first polysilicon layer are etched, a so-called stringer will occur by squeezing the polysilicon of the second polysilicon layer into the undercut after the deposition of the second polysilicon layer so that the control gates of all of the memory cells which are connected in parallel are connected to one another, thereby resulting in cell failure.

SUMMARY OF THE INVENTION

Therefore, the objective of the present invention is to provide a low cost method for manufacturing a memory cell which has a high capacitance coupling ratio and a high integrity.

According to the present invention, a method for manufacturing a memory cell includes the steps of: implanting impurities into a silicon substrate so as to form first and second buried regions that are spaced by a channel; depositing a gate oxide layer over the silicon substrate; removing a portion of the gate oxide layer which is over the channel; depositing a first polysilicon layer over remaining portions of the gate oxide layer and over exposed portion of the silicon substrate; growing an insulating layer over the first polysilicon layer; providing a first mask on the insulating layer, the first mask extending along the channel and having a length shorter than that of the insulating layer, the first mask further having two end portions which overlap respectively the first and second buried regions; etching portions of the insulating layer and the first polysilicon layer not covered by the first mask down to the gate oxide layer; removing the first mask; depositing a thin oxide layer over a remaining portion of the insulating layer; depositing a second polysilicon layer over the thin oxide layer and over the first and second buried layers; providing a second mask on the second polysilicon layer to define a control gate region, the second mask having a width narrower than that of the second polysilicon layer; etching portions of the second polysilicon layer not covered by the second mask so as to form a control gate; removing the second mask; growing a thick oxide layer on a remaining portion of the second polysilicon layer, the thick oxide layer being thicker than the insulating layer; and etching the insulating layer and the first polysilicon layer with the thick oxide layer serving as a mask so as to form a floating gate beneath the control gate.

BRIEF DESCRIPTION OF THE DRAWINGS

Other features and advantages of the present invention will become apparent in the following detailed description of the preferred embodiment, with reference to the accompanying drawings, of which.

DETAILED DESCRIPTION OF THE PREFERRED EMBODIMENT

FIGS. 3 to 12 depict the preferred embodiment of a method for manufacturing a memory cell according to the present invention.

Figure 1:
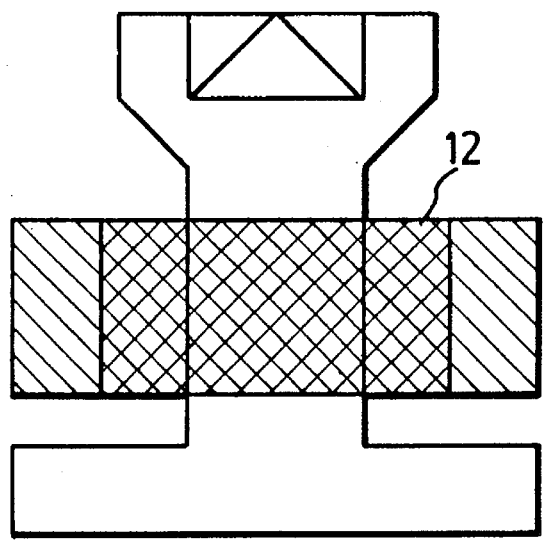
FIG. 1 is a schematic top view of a first type of a conventional memory cell manufactured by a first conventional method.
Figure 2:
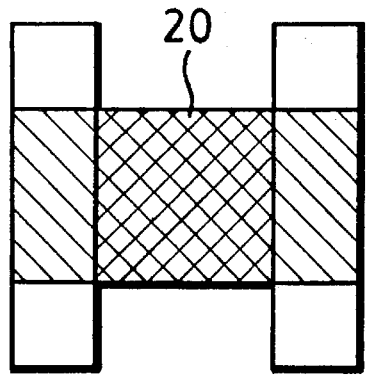
FIG. 2 is a schematic top view of a second type of a conventional memory cell manufactured by a second conventional method.
Figure 3:
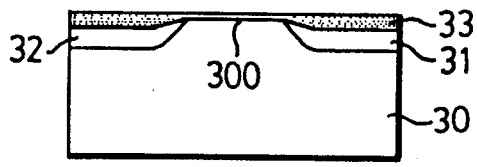
FIGS. 3 to 11 depict the steps of the preferred embodiment of a method for manufacturing a memory cell according to the present invention.

With reference to FIG. 3, a silicon substrate 30 is implanted with impurities so as to form first and second buried regions, 31 and 32, which are spaced by a channel 300 and which serve respectively as drain and source terminals of the memory cell to be manufactured. In the present embodiment, the silicon substrate 30 is a P-type silicon substrate and the impurities are N-type impurities. A gate oxide layer 33 is deposited over the silicon substrate 30.

Figure 4:
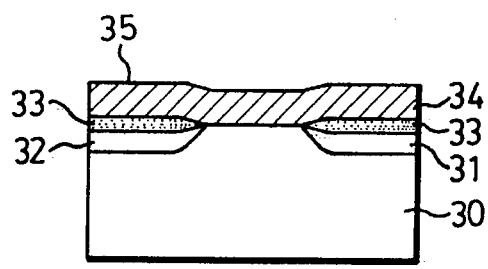

Referring now to FIG. 4, a portion of the gate oxide layer 33, which is over the channel 300, is removed. A first polysilicon layer 34 is deposited over remaining portions of the gate oxide layer 33 and over the exposed portion of the silicon substrate 30. Then, an insulating layer 35 is grown over the first polysilicon layer 34. In the present embodiment, the insulating layer 35 has a thickness between 100–1000 Å and contains silicon nitride and silicon dioxide. It should be noted that the silicon nitride and the silicon dioxide can be arranged in a manner of SiO2/Si3N4/SiO2 or in a manner of Si3N4/SiO2.

Figure 5:
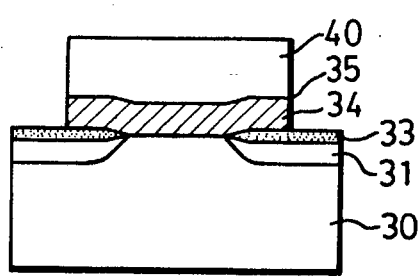
Figure 6:
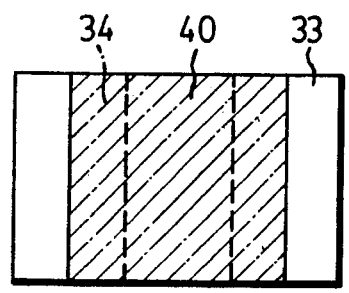

With reference to FIG. 5 and in conjunction with FIG. 6, which is a top view of FIG. 5, a first mask 40 is provided on the insulating layer 35. In the present embodiment, the first mask 40 extends along the channel 300 and has a length shorter than that of the insulating layer 35. The first mask 40 further has two end portions which overlap respectively the first and second buried regions, 31 and 32. In the present embodiment, the total length of the two end portions of the first mask 40 is less than 2 μm. Then, portions of the insulating layer 35 and the first polysilicon layer 34 not covered by the first mask 40 are etched down to the gate oxide layer 33. In the present embodiment, the etching step of the portions of the insulating layer 35 and the first polysilicon layer 34 not covered by the first mask 40 is a dry etching step.

Figure 7:
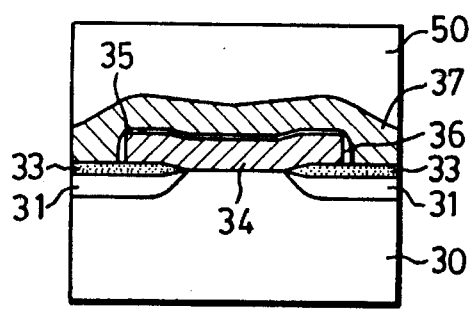
Figure 8:
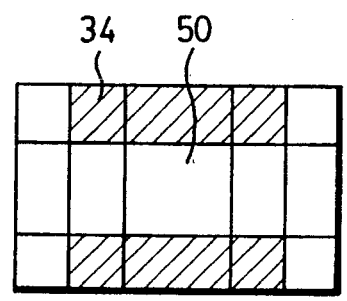

Referring now to FIG. 7 and FIG. 8, which is a top view of FIG. 7, a thin oxide layer 36 is deposited over a remaining portion of the insulating layer 35 after the first mask 40 is removed. It should be noted that, since the thin oxide layer 36 has a thicker deposition at two sides of the first polysilicon layer 34, an SiO2 layer of approximately 50 Å is grown from the first polysilicon layer 34 on the principle that SiO2 cannot be easily grown from Si3N4. Then, a second polysilicon layer 37 is deposited over the thin oxide layer 36 and over the first and second buried layers, 31 and 32. A second mask 50 is provided on the second polysilicon layer 37 to define a control gate region. In the present embodiment, the second mask 50 has a width narrower than that of the second polysilicon layer 37. Then, portions of the second polysilicon layer 37 not covered by the second mask 50 are etched so as to form a control gate. In the present embodiment, the etching step of the second polysilicon layer 37 is a dry etching.

Figure 9:
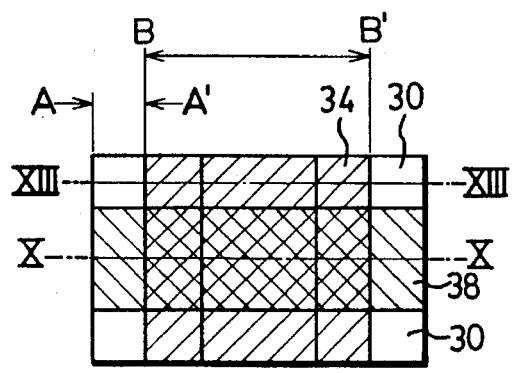
Figure 10:
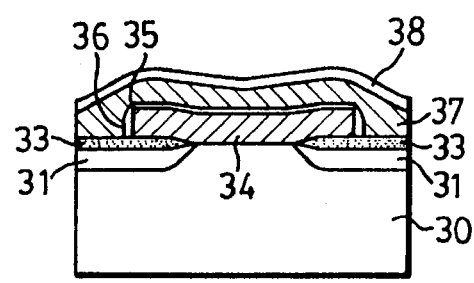

Referring now to FIG. 9 and FIG. 10, which is a sectional view taken along the line X—X of FIG. 9, a thick oxide layer 38 is grown on a remaining portion of the second polysilicon layer 37 after the second mask 50 is removed. In the present embodiment, the thick oxide layer 38 is grown at a temperature ranging from 800°–1200° C. The thick oxide layer 38 is thicker than the insulating layer 35.

Figure 11:
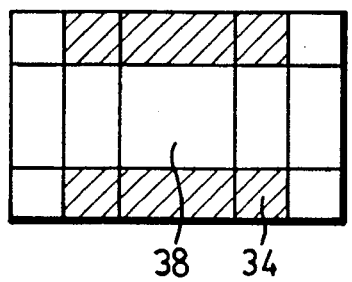
Figure 12:
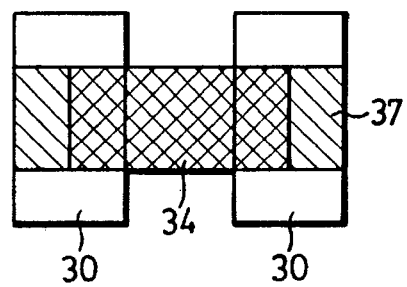
FIG. 12 is a top view of a memory cell manufactured by the preferred embodiment.

Referring to FIG. 11, which is a top view of FIG. 10, the insulating layer 35 and the first polysilicon layer 34 are etched with the thick oxide layer 38 serving as a mask so as to form a floating gate beneath the control gate. The resultant memory cell is shown in FIG. 12. It should be noted that the floating gate would have two end portions which have a total length equal to that of the first mask 40. In addition, it should be appreciated that using the thick oxide layer 38 as a mask in the self-aligned etching step can prevent the occurrence of trench effect on the first and second buried layers, 31 and 32, during etching.

Accordingly, the method for manufacturing a memory cell in accordance with the present invention has the following advantages:

1. Since use of a third mask needed in the aforementioned prior art is obviated, the manufacturing cost is thus lowered.
2. The resultant memory cell has a flat cell structure so that the drain and source terminals of several memory cells can be connected in parallel via the buried layers, 31 and 32, thereby increasing the integrity and reducing the area of the memory cell.
3. Since the total length of the two end portions of the floating gate which overlap the buried layers, 31 and 32, is increased, the capacitance coupling ratio of the memory cell manufactured by the method of the present invention is thus increased, thereby improving the writing characteristic of the memory cell.

4. Since the specification of the photoresist is variable based on the need of the cell designer, the variability of the floating gate and the buried layers, 31 and 32, is more flexible. Furthermore, there is little difference in the resulting cell area.

Figure 13:
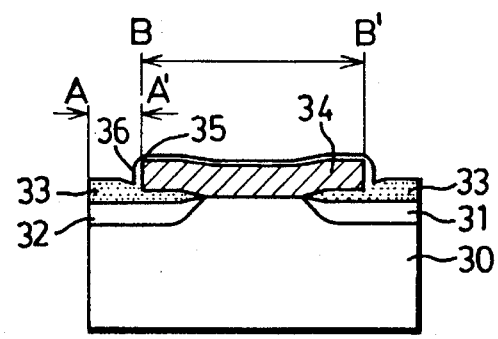
FIG. 13 is a sectional view taken along a line XIII—XIII of FIG. 12.

5. As best shown in FIG. 13 which is a sectional view taken along the line XIII—XIII of FIG. 12, since the region AA' has a thicker silicon dioxide deposition, after the etching of the insulating layer 35, there is a silicon dioxide layer which serves as a terminating indicator for the first and second buried regions, 31 and 32, during the etching of the first polysilicon layer 34, thereby preventing the occurrence of the trench effect due to excessive etching.

6. The stringer will be oxidized to silicon dioxide when the thick oxide layer (silicon dioxide layer) 38 is grown, thereby solving the aforementioned defective cell problem caused by excessive etching.

While the present invention has been described in connection with what is considered the most practical and preferred embodiment, it is understood that this invention is not limited to the disclosed embodiment, but is intended to cover various arrangements included within the spirit and scope of the broadest interpretation so as to encompass all such modifications and equivalent arrangements.

We claim:

1. A method for manufacturing a memory cell, comprising the steps of:

(a) implanting impurities into a silicon substrate so as to form first and second buried regions that are spaced by a channel;

(b) depositing a gate oxide layer over said silicon substrate;

(c) removing a portion of said gate oxide layer which is over said channel;

(d) depositing a first polysilicon layer over remaining portions of said gate oxide layer and over exposed portion of said silicon substrate;

(e) growing an insulating layer over said first polysilicon layer;

(f) providing a first mask on said insulating layer, said first mask extending along said channel and having a length shorter than that of said insulating layer, said first mask further having two end portions which overlap respectively said first and second buried regions;

(g) etching portions of said insulating layer and said first polysilicon layer not covered by said first mask down to said gate oxide layer;

(h) removing said first mask;

(i) depositing a thin oxide layer over a remaining portion of said insulating layer;

(j) depositing a second polysilicon layer over said thin oxide layer and over said first and second buried layers;

(k) providing a second mask on said second polysilicon layer to define a control gate region, said second mask having a width narrower than that of said second polysilicon layer;

(l) etching portions of said second polysilicon layer not covered by said second mask so as to form a control gate;

(m) removing said second mask;

(n) growing a thick oxide layer on a remaining portion of said second polysilicon layer, said thick oxide layer being thicker than said insulating layer; and (o) etching said insulating layer and said first polysilicon layer with said thick oxide layer serving as a mask so as to form a floating gate beneath said control gate.

2. A method as claimed in claim 1, wherein said silicon substrate is a P-type silicon substrate.

3. A method as claimed in claim 1, wherein said impurities are N-type impurities.

4. A method as claimed in claim 1, wherein, in the step (e), said insulating layer contains silicon nitride and silicon dioxide.

5. A method as claimed in claim 4, wherein said silicon nitride and said silicon dioxide are arranged such that said silicon nitride is between two silicon dioxide layers.

6. A method as claimed in claim 4, wherein said silicon nitride and said silicon dioxide are arranged such that said silicon nitride is above said silicon dioxide.

7. A method as claimed in claim 1, wherein, in the step (n), said thick oxide layer is silicon dioxide.

8. A method as claimed in claim 1, wherein, in the step (f), total length of said two end portions of said first mask is less than 2 μm.

9. A method as claimed in claim 1, wherein said insulating layer has a thickness between 100–1000 Å.

10. A method as claimed in claim 1, wherein said etching step (g) is a dry etching step.

11. A method as claimed in claim 1, wherein said thick oxide layer is grown at a temperature ranging from 800°–1200° C.

12. A method as claimed in claim 1, wherein said second polysilicon layer is etched by means of dry etching.

* * * * *